United States Patent [19]
Cheek, Jr. et al.

[11] 3,947,698
[45] Mar. 30, 1976

[54] CHARGE COUPLED DEVICE MULTIPLEXER

[75] Inventors: Tom F. Cheek, Jr.; James B. Barton, both of Dallas, Tex.

[73] Assignee: Texas Instruments Incorporated, Dallas, Tex.

[22] Filed: Sept. 17, 1973

[21] Appl. No.: 398,285

[52] U.S. Cl.............. 307/221 D; 307/304; 357/24; 357/41
[51] Int. Cl.² H01L 27/10; H03K 13/258; H04J 3/10
[58] Field of Search............ 179/15 A, 15 BL; 307/221 D, 224 R, 224 C; 357/24; 328/37

[56] References Cited
UNITED STATES PATENTS

| | | | |
|---|---|---|---|
| 3,654,499 | 4/1972 | Smith | 357/24 |
| 3,715,485 | 2/1973 | Weimer | 357/24 |
| 3,745,383 | 7/1973 | Sangster | 307/221 D |
| 3,746,883 | 7/1973 | Kovac | 307/221 D |
| 3,760,202 | 9/1973 | Kosonocky | 357/24 |
| 3,763,480 | 10/1973 | Weimer | 357/24 |
| 3,771,149 | 11/1973 | Collins et al. | 357/24 |
| 3,801,884 | 4/1974 | Sequin | 357/24 |
| 3,811,055 | 5/1974 | Weimer | 357/24 |
| 3,814,955 | 6/1974 | Itoh et al. | 357/24 |
| 3,819,953 | 6/1974 | Puckette et al. | 307/304 |

OTHER PUBLICATIONS

Tompsett et al., "Charge - Coupled Imaging Devices: . . . ", *IEEE Trans. on Electron Devices*, Vol. ED 18, No. 11, Nov. 1971, pp. 992–996.

*Primary Examiner*—William D. Larkins
*Attorney, Agent, or Firm*—Harold Levine; Rene' E. Grossman; Alva H. Bandy

[57] ABSTRACT

A charge coupled device analog multiplexer in which a CCD shift register is characterized by an array of sets of phase electrodes. A plurality of charge packet injection input channels lead to an electrode in each of preselected sets in the array. A transfer gate common to all input channels admits charge packets to the array. A clock applies shift voltages to the array to move said charge packets to the multiplexer output where detector means responds to charge packets appearing at the output.

20 Claims, 14 Drawing Figures

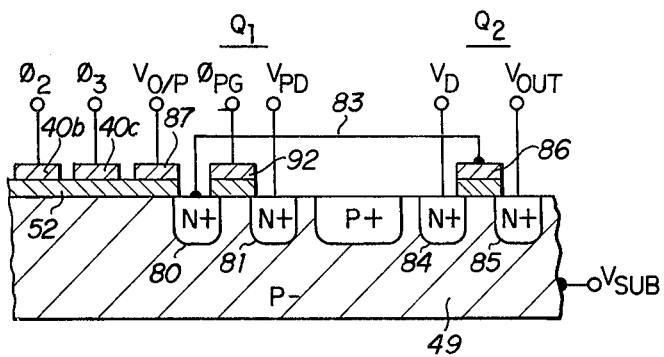
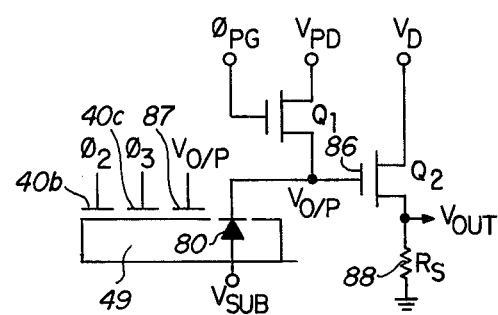
FIG. 9          FIG. 10
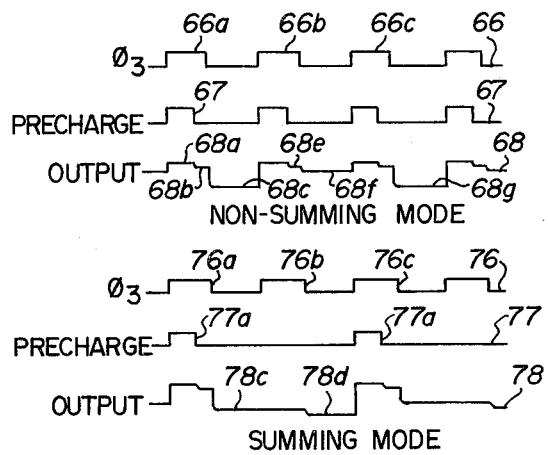
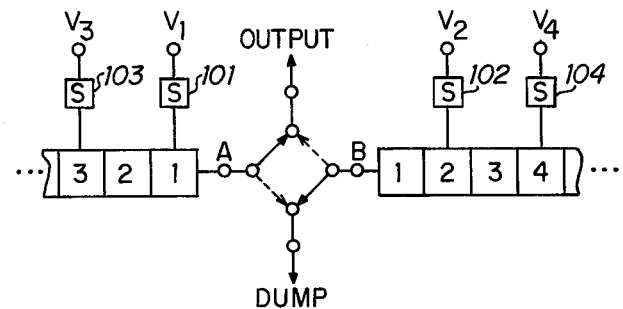
FIG. 11          FIG. 12
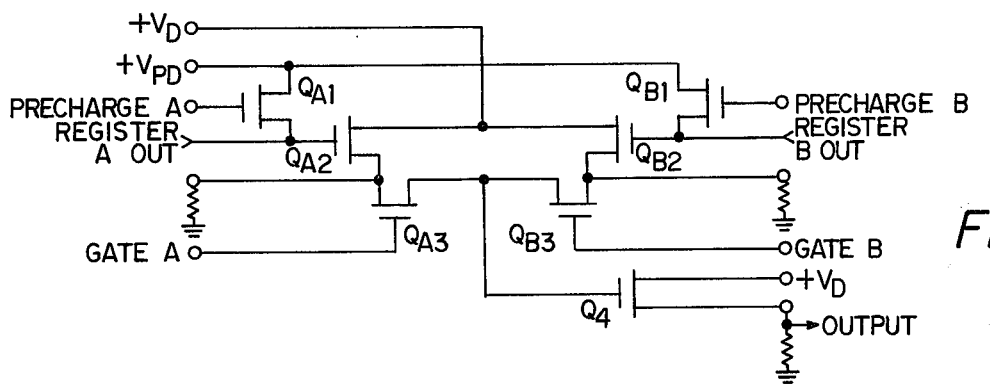
FIG. 13
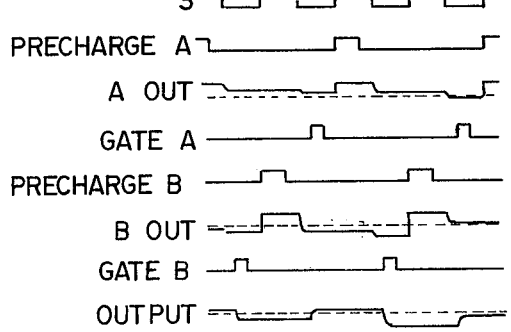
FIG. 14

CHARGE COUPLED DEVICE MULTIPLEXER

This invention relates to a charge couple device (CCD) analog multiplexer. In a further aspect, the invention relates to an isolation element charge coupled device multiplexer.

In the fields of communication, sonar, infrared imaging, and radar, electronic systems often depend on pulse multiplexing techniques to process sensor information to a more suitable and efficient format before transmission. By far the best known and most widely used pulse multiplexing procedures involve frequency-division or time-division. Multiplexing by time-division simplifies the system since relatively simple synchronous control replaces modulators, demodulators, carrier generators, and bandpass filters normally employed in frequency-division systems. Hence, time-division multiplexing systems offer distinct advantages in systems application where simplicity, reliability, and economics are of utmost importance.

It is highly desirable to be able to sample and store analog data simultaneously and with no intervening analog-to-digital conversion. To sample a plurality of signals simultaneously with a single gate pulse and then to store the analog data in a manner to be shifted sequentially out of the device by a simple clock controlled digital logic circuit has been found to be highly desirable. It has been found that charge coupled devices, hereinafter referred to as CCD, possess unique features which permit a new approach to implementation of time-division analog multiplexing in an integrated circuit form.

The present invention provides the ability in a CCD to store charge packets representative of analog data samples from a plurality of parallel input channels with subsequent shifting out of the device serially with no intervening analog-to-digital conversion.

More particularly, in accordance with the present invention, a charge coupled device analog multiplexer is provided in which a CCD shift register is characterized by an array of sets of phase electrodes and in which a plurality of charge injection channels are provided with one such channel leading to an electrode in each of a plurality of preselected electrode sets in the array. The sets of phase electrodes are customarily referred to as elements of the CCD. A transfer gate common to all of the output channels is then actuated to admit charge packets into the array. The charge packets may then be clocked to the output of the array.

In a further aspect of the invention, the input channels are connected to input electrodes which are separated by at least one set of electrodes to provide isolation of the charge packets, thereby reducing interchannel cross talk.

In a further aspect, attenuation effects are overcome.

For a more complete understanding of the invention and for further objects and advantages thereof, reference may now be had to the following description taken in conjunction with the accompanying drawings in which:

FIG. 9 illustrates an output preamplifier circuit structure;

FIG. 10 is a schematic diagram of the circuit of FIG. 9;

FIG. 11 illustrates the sequence of operations of the system of FIG. 10;

FIG. 12 illustrates a dual isolation-element CCD multiplexer arrangement;

FIG. 13 is a schematic diagram of the dual isolation-element multiplexer output; and FIG. 14 is a timing diagram for the system of FIGS. 12 and 13.

FIGS. 1 AND 2

Figure 1:
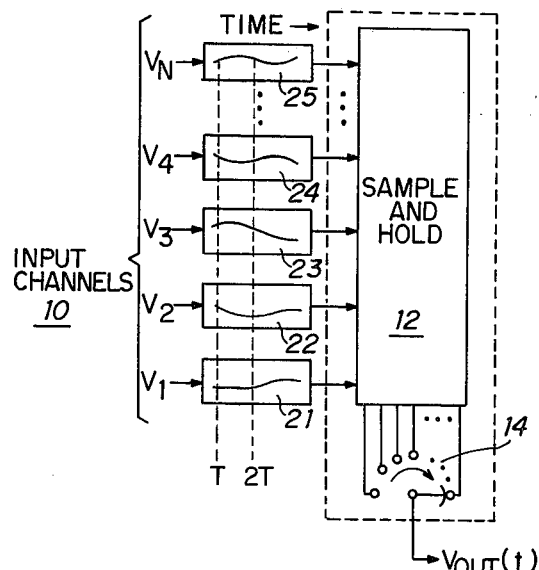
FIG. 1 is a block diagram of a time-division multiplexer.
Figure 2:
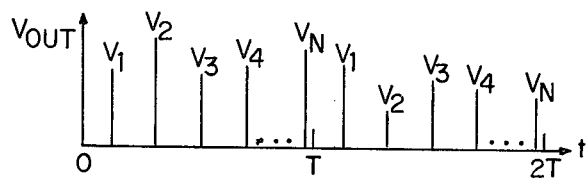
FIG. 2 illustrates a single channel output waveform from a time-division multiplexer.

FIG. 1 is a functional representation of a CCD multiplexer expressed in terms of conventional components. A plurality of input channels 10 are connected in parallel to a sample and hold unit 12. The input channels 10 provide signals $V_1 \ldots V_n$ whose amplitudes vary with time as generally represented by the curves 21 . . . 25. The sample and hold unit 2 serves a conventional and well known function of sampling the signals first at time T and again at time 2T and at like intervals thereafter. The samples thus stored in the unit 12 are then sequentially read out by action of a commutator 14 so that the output voltage train as a time function will appear as illustrated in FIG. 2. Thus, the multiplexer of FIG. 1 provides a pulse-amplitude-modulated output for the N inputs of FIG. 1. The foregoing operation requires two essential steps, (a) sample and hold in unit 12, and (b) commutation of the samples out through a unit such as commutator 14.

The present invention relates to an integrated circuit device which is capable of converting M parallel input channels to a single-channel pulse-amplitude-modulated output eliminating the need for exact timing of synchronized pulse generators to determine the exact time slot in which each output channel is sampled as is required in commutator-type systems.

In accordance with the present invention, sampled information is stored in a CCD as charge packets which are sequentially read out of the CCD as an output signal.

FIG. 3

Figure 3:
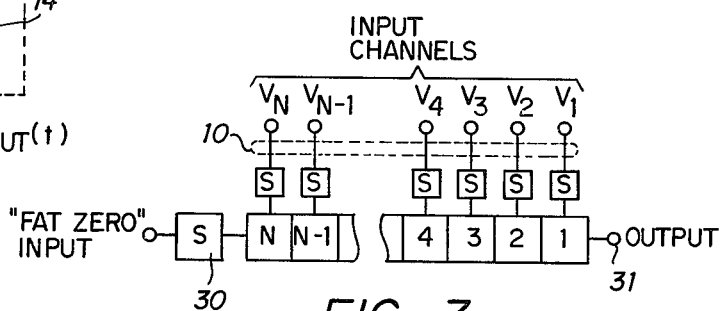
FIG. 3 is a schematic view of a CCD multiplexer.

A basic structure embodying the invention is illustrated in FIG. 3. A CCD delay line comprises an optional source 30 and delay line elements 1 . . . N, formed in a semiconductor chip such as a P-type silicon substrate. Samplers $S_1 \ldots S_N$ are provided for entering into delay line elements 1-N samples of the signals $V_1 \ldots V_N$. The system provides for the simultaneous entry of the charge packets representative of samples of signals $V_1 \ldots V_N$ followed by clocking the packets to a single channel output line 31.

FIG. 4

Figure 4:
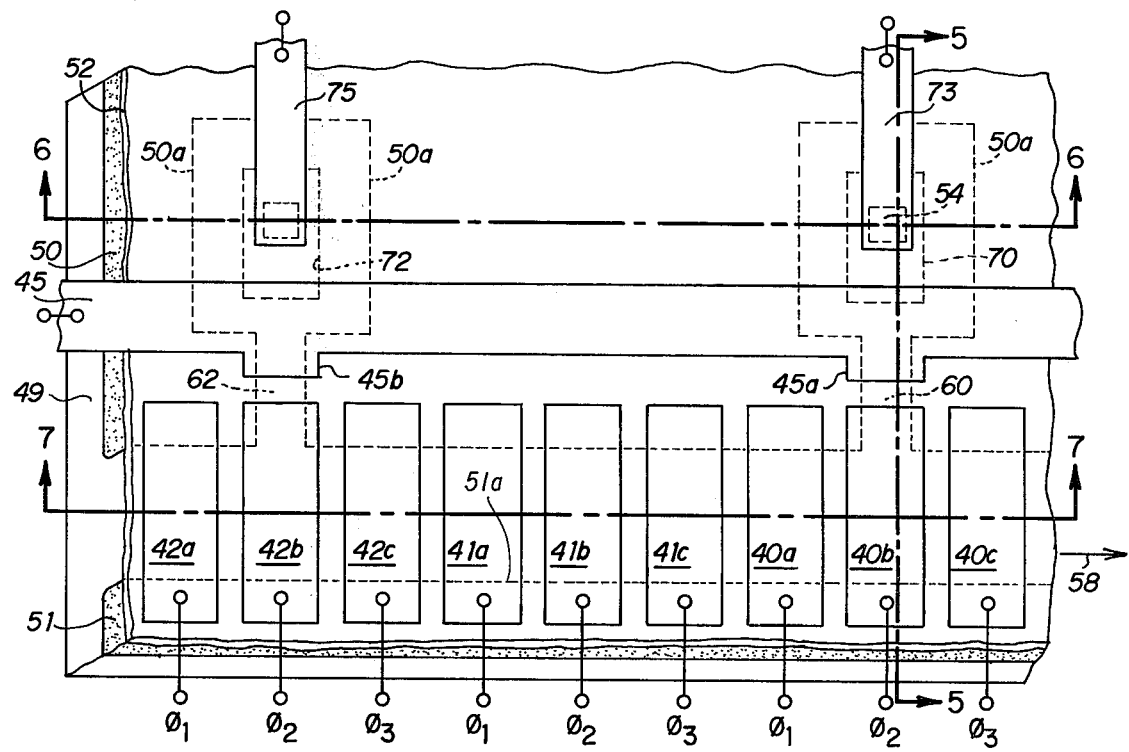
FIG. 4 is a plan view of an embodiment of the present invention.

A layout and design of an embodiment of the present invention is illustrated in FIG. 4. This embodiment will be recognized as a surface channel $n$-channel, three phase, single level metal CCD multiplexer. It will be apparent that a buried channel type CCD multiplexer may also be constructed in accordance with the present invention.

In FIG. 4 an input set of electrodes 40a–40c is adjacent to an isolation set 41a–41c which in turn is adjacent to an input set 42a–42c. The electrodes 40a–42c are supported on an oxide layer 52 which is formed on the top surface of a semiconductor substrate 49. In addition to electrodes 42a–42c, an elongated transfer gate electrode 45 also is supported on the oxide layer 52. Transfer gate 45 has a protrusion 45a which is in alignment with the end of electrode 40b. It also has a protrusion 45b which is in alignment with the end of electrode 42b. The electrodes 40a–40c and gate 45 are formed on the oxide layer 52 by conventional metal deposition techniques followed by conventional etching techniques.

The system shown in FIG. 4 is a fragmentary part of a larger structure. The three sets of electrodes 40a–c, 41a–c and 42a–c form two input sets and one isolation set. In one embodiment, the complete array had 16 sets of input electrodes each separated by an isolation set. FIG. 4 is representative of the structure. Substrate 49 has two channel stop diffusion zones 50 and 51 formed therein. Diffusion zone 51 is a continuous zone, one boundary of which corresponds to the dotted outline 51a. The other channel stop diffusion zone 50 has a boundary indicated by the dotted line 50a.

One edge of the electrode array overlays the edge 50a of channel stop diffusion zone 50. The other edge of the electrode array overlays the edge 51a of channel stop diffusion zone 51. One edge of channel stop zone 50 is broken to form inlet channels 60 and 62 and to provide bays for sample diodes 70 and 72. Leads 73 and 75 extend from diodes 70 and 72, respectively.

Transfer gate 45 extends the length of the electrode array and overlays parts of channels 60 and 62 as well as parts of associated diodes 70 and 72. Optional source 30, FIG. 3, is provided for introducing minority carriers to the Si-SiO$_2$ interface in order to produce a background charge level referred to in the art as a "fat zero."

FIGS. 5–7

Figure 5:
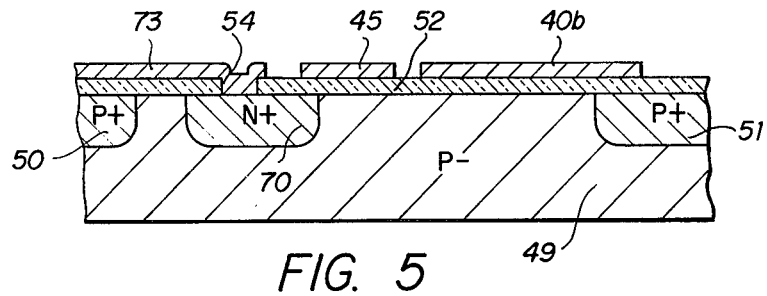
FIG. 5 is a sectional view of the unit of FIG. 4 taken along lines 5—5 of FIG. 4.

In FIG. 5, a sectional view taken along lines 5—5 of FIG. 4 illustrates details of the input structure. Silicon chip 49 has p+ diffusion zones forming the channel stops 50 and 51. A silicon dioxide layer 52 extends over the surface of chip 49. An n+ diffusion zone forms diode 70. Contact to diode 70 is made through a window 54 in layer 52. An aluminum electrode 73 contacts diode 70.

Figure 6:
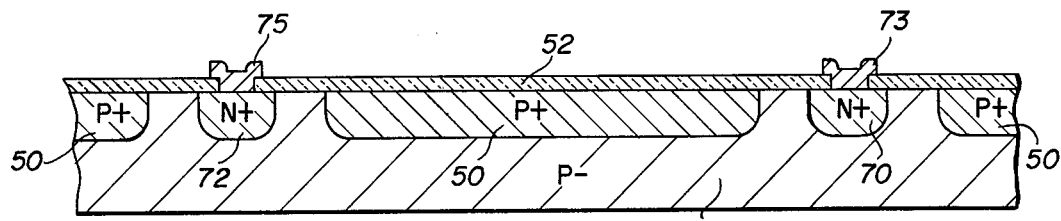
FIG. 6 is a sectional view of the device of FIG. 4 taken along lines 6—6 of FIG. 4.

In FIG. 6, the section taken along line 6—6 of FIG. 4 passes through the diodes to show the relation between the diodes and the associated channel stop diffusion zones 50 and 51. Diodes 70 and 72 are spaced laterally. The channel-stop diffusion zone 51 appears to be segmented. Input electrodes 73 and 75 contact diodes 70 and 72.

Figure 7:
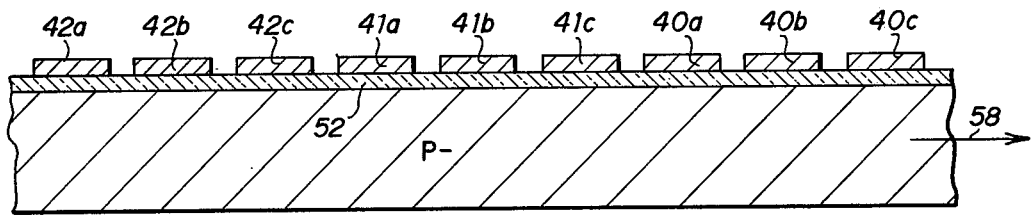
FIG. 7 is a sectional view taken along lines 7—7 of FIG. 4.

In FIG. 7, phase electrodes 40a–41c appear in section on top of oxide layer 52.

FIG. 8

Once the charge packets are introduced into the channel between stops 50 and 51, they may then be transferred or clocked in the direction of arrow 58 by application of transfer voltages to the electrode array.

Figure 8:
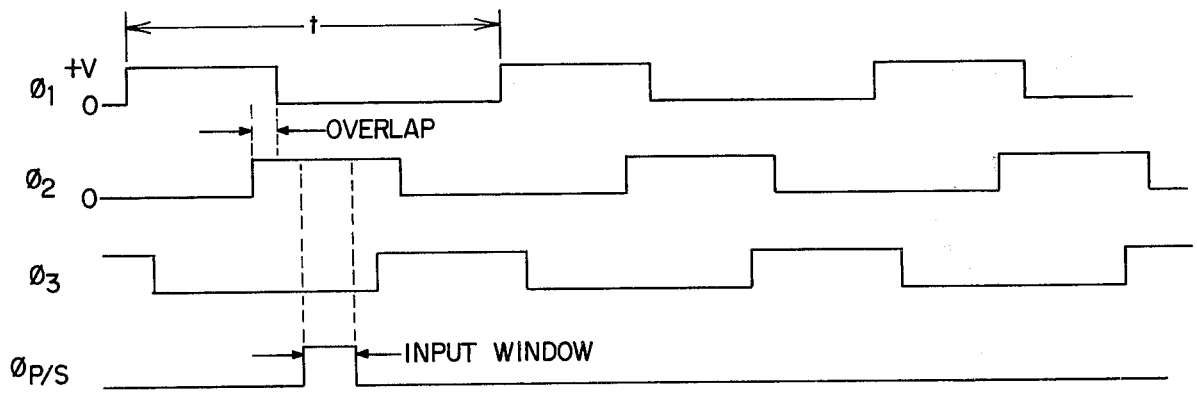
FIG. 8 illustrates the relationship between the three phase clock signals employed in the system of FIG. 4.

As illustrated in FIG. 8, voltage $\phi_1$ comprises a square wave voltage having a period $t$ with the positive pedestal of length slightly less than $t/2$. It is required that pedestals of square waves, trapezoidal or otherwise shaped (a) overlap between adjacent phases, as shown, and (b) all phases must not be high simultaneously. The waveform $\phi_2$ has the same period t but is delayed 120°. The voltage $\phi_3$ has the same period t but is delayed 240° with respect to $\phi_1$. The three phase voltages $\phi_1$, $\phi_2$ and $\phi_3$ vary from some low potential, such as ground, to some positive voltage. In this embodiment, substrate 49 was biased to about −5 volts. The voltages $\phi_{1-3}$ had a range from 0 to + 15 volts. The signal levels preferably then had a usable range of from somewhat above 0 volts to not more than about +15 volts.

Waveform $\phi_1$ was applied to electrodes 40a, 41a and 42a. Waveform $\phi_2$ was applied to electrodes 40b, 41b and 42b. Waveform $\phi_3$ was applied to electrodes 40c, 41c and 42c.

A waveform $\phi_{P/S}$ represents the voltage waveform applied to the transfer gate 45. It coincides with the center portion of a selected pedestal in the waveform $\phi_2$ and establishes a time gate or window during which charge packets simultaneously are admitted to the zone between channel stops 50 and 51 through all of the diodes. Such waveform would occur at times T, 2T, FIG. 1. Expressed mathematically, the amount of charge entering the potential well at the $k$th element from the output at time equal to zero, Q($k$,0), is given by Equation 1:

$$Q(k,0) = C_{ox}(V_{\phi_2} - V_t - V_k) \qquad (1)$$

where $C_{ox}$ is the oxide capacitance.

A charge packet, upon reaching the output, changes the output voltage by $\Delta V_{o/p}$, given by $$\Delta V_{o/p} = \frac{Q(0,k)}{C_{o/p}} \qquad (2)$$

where $Q(0,k)$ is the amount of charge that is remaining in the charge packet initially at the $k$th element, after being shifted to the output node, and $C_{o/p}$ is the total capacitance associated with this node.

Charge is transferred into the serial delay line at electrode 40b only when a potential well, a virtual drain, is created under electrode 40b and when the transfer gate 45 is pulsed by waveform $\phi_{P/S}$ to a voltage greater than the threshold voltage, $V_t$, above the voltage $V_k$ which is the input signal voltage on diode 70a. The charge entering the potential well at a $k$th element from the output is proportional to the signal voltage on the input electrode leading to the diode.

FIGS. 9 and 10

On the chip 49 a preamplifier structure is provided for sensing each charge packet as it arrives at the output end of the multiplexer. This structure is useful in the operation of the device, but is not critical to the implementation of the multiplexer. Such a system is diagrammatically illustrated in FIGS. 9 and 10. FIG. 9 illustrates the structure and FIG. 10 the circuit involved. Substrate 49 on which the surface oxide layer 52 is formed and only the last two electrodes are shown. Voltages $\phi_2$ and $\phi_3$ are applied to electrodes 40b and 40c. A field effect transistor comprises N+ diffusion zones 80 and 81 together with a surface electrode 92. An output diode is formed by zone 80 and is connected by conductor 83 to the base of a source-follower field effect transistor $Q_2$ which comprises the N+ diffusion zones 84 and 85 and the surface electrode 86.

An output gate electrode 87 is positioned between $\phi_3$ electrode and zone 80. A constant positive voltage $V_D$ about the same magnitude as the peak of voltages $\phi_1$, $\phi_2$ and $\phi_3$ is applied to diode 84. A low level constant positive voltage is applied to electrode 87.

Charge packets clocked under the $\phi_3$ electrode cannot spill over the surface barrier created by the voltage on electrode 87 until the $\phi_3$ voltage drops. The bias voltage $V_{sub}$ on the substrate 49 appears across the diode formed by the diffusion zone 80. Prior to clocking a charge packet under the $\phi_3$ electrode, transistor $Q_1$ is pulsed on by a voltage pulse $\phi_{PG}$ to precharge diode 80 to the level of $V_{PD}$. Then when phase $\phi_3$ drops, the charge packet spills over and partially discharges diode 80. The circuit including electrode 86 is very high impedance. Thus, the charge from diode 80 is stored and controls conduction through transistor $Q_2$. This controls the output voltage across resistor 88.

Thus, as shown in FIGS. 9 and 10, the on-the-chip preamplifier consists of an MOS precharge device and an MOS source follower which detects the output voltage drop caused by arriving charge packets. Diode 80 is precharged to a given voltage by a clock $\phi_{PG}$ prior to being partially discharged by the charge packet.

A key consideration in the performance of a CCD is how efficiently the charge packet is transferred from one element to the next. In general, there is no net loss of charge. However, a small fraction of each charge packet is usually left behind with each transfer. There are several different factors which influence the charge transfer efficiency of a CCD multiplexer. In a surface-channel device as above described, fast interface states are an important loss mechanism. Further, at high frequencies, the transfer efficiency becomes limited by diffusion time or field-aided-drift velocity effects. The resulting charge loss in the trailing packets will eventually become substantial. This is true even in buried channel structures, but more pronounced in surface channel units as here described. The gaps between the metal electrodes 40a–41c, FIG. 4, cannot be made much smaller than $10^{-4}$ inches with conventional integrated circuit photolithography. If the oxide layer in the gap between electrodes is exposed, the surface potential cannot be effectively controlled at such gaps. As a result, potential barriers or wells may exist which can degrade the charge transfer efficiency. In the CCD multiplexer here described, the effect of the exposed oxide is still greater because the channel stop 50 is interrupted to allow for the parallel inputs. At points of interruption, an additional gap exists between the serial phase electrode and the transfer gate. Thus, the charge transfer efficiency of a CCD multiplexer structure can be inferior to that of prior art serial registers which have unbroken channel stops. In the multiplexer, charge transfer inefficiency tends to result in two effects that would degrade performance. The first is nonuniform attenuation and the second is interchannel cross talk. In accordance with a preferred embodiment of the present invention, both of these effects are rendered insignificant.

Nonuniform attenuation in a multiplexer normally is to be expected any time there is less than 100% transfer of a charge packet. This will be readily apparent when it is noted that in FIG. 3 the charge at element 1 undergoes only a single element transfer whereas the charge at element N undergoes N element transfers, leaving behind a small portion of the charge in the course of each element transfer. In serial shift registers, this problem is not present because all charge packets undergo the same number of shifts. However, in a multiplexer, each charge packet undergoes shifts, the number of which differs from the number of shifts of every other charge packet.

Interchannel cross talk is the result of one signal charge packet leaving a percentage of its charge behind when shifted so that trailing signal charge packets will pick up the residue charge.

In accordance with the present invention, interchannel cross talk is substantially eliminated by the arrangement illustrated in FIG. 4 wherein input diodes are associated with sets of electrodes which are separated by at least one set of electrodes having no input. In the system illustrated in FIG. 4, diode 70 is associated with electrode 40b. Diode 72 is associated with electrode 42b. Electrodes 41a, b and c are not associated with an input diode. Electrodes 41a–41c form one set of isolation electrodes. Isolation electrodes ae clocked by transfer voltage pulses $\phi_1$, $\phi_2$ and $\phi_3$ the same as the input electrode sets. Charge transfer efficiency of the order of 99.7% per element transfer is typical for devices of the character here described. The improvement in eliminating cross talk by the present invention will be appreciated when it is understood that the following can be shown:

In a device without isolation, 20 element transfers in a unit (of 99.7% efficiency per element transfer) would result in interchannel cross talk of about −24db.

In a like system with isolation, the interchannel cross talk is much less, at a level of about −42db.

Thus, in a preferred embodiment of the invention, the electrode sets associated with input diodes will be spaced apart with at least one intervening set of isolation electrodes.

The basic operation of a multiplexer with isolation elements is the same as a CCD multiplexer without isolation elements and with inputs at every element position except for two aspects: (a) with isolation, input data is transferred into the multiplexer at only every other element position; and (b) for the same output data rate as in a multiplexer without isolation, the clock frequencies of the phase electrodes in a multiplexer with isolation must be doubled.

Two methods can be used to obtain the output voltage signal: (a) monitor the voltage fluctuations of the primary charge packet and dump the isolation packet; and (b) sum the primary and isolation packets, thereby reducing the attenuation resulting from poor charge transfer efficiency. Thus, the isolation element CCD multiplexer not only has reduced interchannel cross talk, but when operated with summed outputs, makes inconsequential the nonuniform attenuation.

FIG. 11

In FIG. 11, waveforms 66–68 indicate operation of the system of FIGS. 9 and 10 in a non-summing mode and waveforms 76–78 indicate operation in the summing mode.

Waveform 66 represents the voltage $\phi_3$ of FIG. 9. During the interval that the waveform 66 is high, the precharge voltage $\phi_{PG}$ goes high to charge the diode 80. That is, the $\phi_{PG}$ waveform includes pedestal 67a during the interval that pedestal 66a exists. This causes the output voltage as it appears across resistor 88 to go high as indicated by the level of line 68a.

When the precharge voltage $\phi_{PG}$ drops, then the output voltage drops slightly to line 68b. However, when the pedestal 66a terminates, the charge under the last gate electrode spills onto diode 80. This causes the level to drop to line 68c. The output voltage level is represented by line 68c. Line 68c represents the difference between the level 68b and level 68c. This difference is proportional to the charge packet.

It will be noted that on the next pedestal of the voltage $\phi_3$, i.e., pedestal 66b, the same sequence takes place except that the charge packet under the isolation electrode is much smaller so that the output voltage is represented by the difference between the lines 68e and 68f. However, responsive to the next pedestal 66c, the charge packet is represented by line 68g. Thus, in the non-summing mode, charge packets are sensed and the portion of the charge in the isolation packet is dumped.

Waveforms 76, 77 and 78 illustrate operation in a summing mode. In this mode, the precharge pedestal 77a occurs only during the alternate pedestals 76a and 76c of the $\phi_3$ voltage. There is no precharge operation during pedestal 76b. This means that when a charge packet flows onto diode 80, output level 78c is produced. Later, however, the trailing isolation charge passes onto diode 80 to change to the output level 78d. By this operation, the charge packet and the charge left in the isolation electrodes on a transfer operation are both shifted into the output where the sum is sensed.

FIGS. 12–14

An embodiment of the invention in which isolation is provided and in which the clock frequency of the phase electrodes is the same as the output data frequency is illustrated in FIG. 12. This is a dual isolation-element CCD multiplexer each half of which has storage nodes 1,2 . . . n. It includes the two halves or sections A and B. In this unit, the input voltages $V_1$ and $V_3$ to be sampled are connected through samplers 101 and 103. The signals $V_2$ and $V_4$ are connected through samplers 102 and 104. Sampler 101 feeds storage node 1 in section A. Sampler 103 feeds node 3 in section A. Sampler 102 feeds node 2 in section B and sampler 104 feeds node 4 in section B. The output system operates such that the charge packets are sensed in the order $V_1$, $V_2$, $V_3$ and $V_4 \ldots V_n$.

The output circuitry for this system is illustrated in FIG. 13 with suitable waveforms shown in FIG. 14. The circuit of FIG. 13 will be recognized as comprising two circuits such as shown in FIG. 10 together with commutation circuitry. More particularly, the transistors $Q_{A1}$ and $Q_{A2}$ correspond in function with transistors $Q_1$ and $Q_2$ of FIG. 10. Similarly, transistors $Q_{B1}$ and $Q_{B2}$ correspond with transistors $Q_1$ and $Q_2$ of FIG. 10. Transistors $Q_{A3}$ and $Q_{B3}$ are switching transistors and transistor $Q_4$ is an output transistor which is connected to the output resistor.

The output diode of section A is connected to charge the capacitance associated with transistor $Q_{A2}$. Transistor $Q_{A1}$ provides a precharge for section A. Section B is connected to charge the capacitance associated with transistor $Q_{B2}$ with a precharge being supplied through transistor $Q_{B1}$. Charge packets are ejected from both sections A and B upon the turn off (fall) of the $\phi_3$ clock pulse. One of the packets will be a primary packet and the other an isolation packet. When the primary packet is ejected by section A and the isolation packet by section B, the primary packet partially discharges the gate capacitance of transistor $Q_{A2}$. The gate of transistor $Q_{B2}$ already is partially discharged by a primary charge packet and is now further discharged by the isolation packet. The voltage $V_B$ on the gate of transistor $Q_{B2}$ is representative of the sum of the charge in the earlier primary packet and the charge in the present isolation packet. Transistor $Q_{B3}$ is now pulsed on bringing the gate of transistor $Q_4$ to approximately $V_B - V_T$ where $V_T$ is a threshold voltage for the device since transistor $Q_{B2}$ is operated as a source-follower. The output voltage then swings toward $V_B - 2V_T$ and will hold at this voltage after transistor $Q_{B3}$ is turned off. A precharge positive pulse is now applied to the gate of transistor $Q_{B1}$ restoring the output node of the multiplexer section B to its initial voltage. Upon the next turn off of the $\phi_3$ clock pulse, a primary pulse is ejected from multiplexer section B and an isolation pulse from multiplexer section A. The entire sequence is then repeated but with the roles of sections A and B interchanged. The output circuitry of the dual isolation-element multiplexer functions both as a commutator and as a sample and hold gate. Aside from this circuitry, each half of this multiplexer is identical to the single isolation-element multiplexer described above and will have the same minimization of interchannel cross talk.

Having described the invention in connection with a specific embodiment, namely the surface channel, N-channel, three-phase, single level metal CCD multiplexer, it will be recognized that one-phase, two-phase and four-phase CCD multiplexers may be constructed embodying the present invention. Further, multi level conductor type CCD multiplexers may also be constructed in accordance with the present invention. They may also be of the p-channel type. They may also be of the buried channel type.

The embodiments of the invention described have involved use of silicon substrates as the basic building block. It will be appreciated that different semiconductor materials may be employed as the substrate.

In FIG. 4 channel stop zones 50 and 51 have been described as being two separate and presumably isolated zones. It will be understood that they are parts of a single diffusion zone, portions of which are shown in FIG. 4, the diffusion being such that a longitudinal channel extends along the surface of the substrate 49 with boundaries 50a and 51a. The end boundaries of the channel have not been shown for simplicity in illustration.

Preamplifier structures are shown at the outputs of the units illustrated in the drawings. They are built onto the same substrate as the multiplexer itself. Such preamplifier structure is useful in the operation of the device but need not be included in the same chip and is not critical to the implementation of the multiplexer. From the standpoint of signal-to-noise characteristics, an on chip construction of the preamplifier is preferable. Further, an integrating type preamplifier is preferred because of its accuracy.

The foregoing description shall be taken as embodying the present invention. It will be apparent that modifications and changes therein may be made by those skilled in the art without departing from the invention as set forth in the appended claims.

What is claimed is:

1. A charge coupled device analog signal multiplexer which comprises:

a. a charge coupled device shift register characterized by an array of sets of phase electrodes, b. a plurality of charge packet injection input channels, each including means for providing charge packet inputs representative of time samples of respective analog signal inputs at an electrode location only in a pre-selected number of said phase electrode sets less than the total number of said sets, the remainder of said sets defining isolation electrode sets disposed between said pre-selected electrode sets to provide isolation sets not connected to any signal input means, c. a transfer gate common to all of said charge packet input means to admit said charge packets to said array, d. clock means to apply shift voltages to said array to move said charge packets to the multiplexer output, and e. detector means to detect said charge packets at said output.

2. The combination set forth in claim 1 in which:

a. a pair of said arrays are provided, b. said detector means is connected to the outputs of both said arrays, and c. said charge packet injection channels are connected to sets in one of said arrays separated from said detector means by an odd number of sets and connected to sets in the other of said arrays separated from said detector means by an even number of sets.

3. The combination set forth in claim 2 wherein each of said preselected sets comprises three electrodes and wherein one three electrode isolation set is positioned between each of said preselected sets.

4. The combination set forth in claim 1 wherein each of said preselected sets comprises three electrodes and wherein one three electrode isolation set is positioned between each of said preselected sets.

5. The combination set forth in claim 1 wherein said charge coupled device shift register has said array of phase electrodes supported on an insulating layer on a semiconductor substrate with channel stop regions extending the length of said array and on opposite sides thereof and wherein one of said channel stop regions has a plurality of bays leading by way of inlet channels from the section of said semiconductor substrate between said channel stop regions and wherein said means for providing charge packet inputs comprises a diode in each of said bays.

6. The combination set forth in claim 1 in which said CCD shift register is a surface channel device.

7. The combination set forth in claim 1 wherein each said set comprises three side-by-side electrodes.

8. A charge coupled device analog signal multiplexer which comprises:

a. a charge coupled device shift register characterized by an array of sets of phase electrodes, b. a plurality of charge packet injection input channels each including means for providing charge packet inputs representative of time samples of respective analog signal inputs at an electrode location only in a preselected number of said phase electrode sets less than the total number of said sets, the remainder of said sets defining isolation electrode sets disposed between said preselected electrode sets, c. a transfer gate common to all of said charge packet input means to admit said charge packets to said array, d. clock means to apply shift voltages to said array to shift said charge packets to the multiplexer output, and e. detector means for detecting said charge packets at said output and for summing each charge packet with the charge associated with its trailing isolation charge packet.

9. A method of operating a charge coupled device analog signal multiplexer comprising a charge coupled device shift register including an array of sets of phase electrodes, comprising simultaneously injecting charge packet inputs into the shift register, said charge packet inputs being representative of time samples of respective analog signal inputs to be multiplexed and said charge packet inputs being introduced only at phase electrode locations in a preselected number of said phase electrode sets less than the total number of said sets; selectively applying multi-phase clock pulse signals to electrodes of all of said sets of phase electrodes to shift said charge packet inputs serially along said shift register to an output of said multiplexer, and detecting said charge packets at said output to provide a multiplexed output signal.

10. A method according to claim 9, wherein said charge packet inputs are injected only at alternate phase electrode set locations along said shift register.

11. A method according to claim 10, wherein each charge packet detected at said output during one period of said clock signals is summed with a charge packet detected at said output during the next following period of said clock signals.

12. A charge coupled device analog signal multiplexer which comprises:

a. a semiconductor substrate on which an insulating layer supports an array of sets of side-by-side phase electrodes and in which channel stop regions are provided, forming a charge coupled device shift register structure, b. a plurality of diode means located in bays in said channel stop regions having inlet channels leading only beneath preselected elements in pre-determined ones of said sets less than the total number of said sets to inject charge packets into said structure representative of time samples of respective analog signal inputs to said channels, the remainder of the said electrode sets defining isolation sets located between said preselected sets and offset from said inlet channels in said channel stop regions, said isolation sets not being connected to any signal input means, c. connections to apply different voltages to members of said sets to shift said charge packets along said array; and d. detecting means in said structure to detect charge packets arriving at the end of said array.

13. The combination set forth in claim 12 in which said bays and inlets are formed in a channel stop region extending along one boundary of said array.

14. The combination set forth in claim 12 in which each of said inlets is narrower than and underlies an end of one of said electrodes.

15. The combination set forth in claim 14 in which a transfer gate electrode on said insulating layer extends the length of said array and overlays said inlet channels and is spaced from the ends of said electrodes.

16. The combination set forth in claim 14 in which:
  a. channel stop regions define a plurality of channels in said substrate,
  b. different electrode arrays span each of said channels to form a plurality of shift register structures, and
  c. said detector means is connected to the outputs of said structures with input connections through said diode means to regularly spaced elements of one said array beginning with the set adjacent to said detector means and with input connections through said diode means to regularly spaced elements of the other said arrays beginning with sets spaced by regularly increasing number of said sets from said detector means.

17. The combination set forth in claim 16 in which only two channels are defined on a substrate.

18. In an analog signal time division multiplexer which comprises a plurality of signal input channels, each channel including means for providing time varying analog input signals, the combination comprising:
  a. a semiconductor substrate on which there is formed an insulating layer which supports a plurality of sets of side-by-side phase electrodes and in which channel stop regions are provided to form a charge coupled device shift register structure,
  b. a plurality of diode means located in bays in said channel stop regions having inlet channels corresponding with respective ones of said signal channels, said inlet channels leading only beneath pre-selected ones of said electrode sets to inject charge packets into said structure, said plurality of electrode sets including further electrode sets disposed between said pre-selected sets to provide isolation sets not connected with any signal input means, and connections to apply different voltages to members of said electrode sets to shift said charge packets along said shift register structure, and
  c. means in said structure to detect charge packets arriving at the output of said shift register structure.

19. In an analog signal time division multiplex system comprising a plurality of signal input channels, each channel including means for providing time varying analog input signals, a charge coupled device shift register structure including:
  a. a multi-set array of phase electrodes;
  b. a plurality of means connected with each said input channel for providing charge packet inputs representative of time samples of analog signal inputs on said respective input channels at an electrode location only in pre-selected electrode sets in said array, said array including further electrode sets disposed between said pre-selected sets and not connected with any charge packet input means;
  c. transfer gate means common to all of said charge packet input means to admit charge packets therefrom into said shift register only at said pre-selected electrode set locations;
  d. means for clocking along said array charge packets introduced from said input means; and
  e. means to detect the charge packets at the end of said array for producing a multiplexed analog signal output.

20. A charge coupled device analog signal multiplexer which comprises:
  a. a charge coupled device shift register including a first array of phase electrode set means and a plurality of charge packet injection input channels each including means for providing charge packet inputs representative of time samples of respective analog signal inputs at an electrode location in each of said phase electrode set means of said first array;
  b. transfer gate means common to all of said charge packet input means to admit said charge packets to said first array;
  c. disposed between electrode set means of said first array a second array of phase electrode set means for receiving charge packets derived from time samples of respective analog signal inputs only from an adjacent electrode set means of said first array;
  d. clock means to apply shift voltages to said first and second arrays to move said charge packets to the multiplexer output, and
  e. detector means to detect said charge packets at said output.

* * * * *